United States Patent
Wu et al.

(10) Patent No.: US 8,941,974 B2
(45) Date of Patent: Jan. 27, 2015

(54) INTERDIGITATED CAPACITOR HAVING DIGITS OF VARYING WIDTH

(75) Inventors: Zhaoyin D. Wu, San Jose, CA (US); Parag Upadhyaya, San Jose, CA (US); Xuewen Jiang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 380 days.

(21) Appl. No.: 13/229,207

(22) Filed: Sep. 9, 2011

(65) Prior Publication Data

US 2013/0063861 A1     Mar. 14, 2013

(51) Int. Cl.
| | |
|---|---|
| *H01G 4/008* | (2006.01) |
| *H01G 4/228* | (2006.01) |
| *H01G 4/005* | (2006.01) |
| *H01L 49/02* | (2006.01) |

(52) U.S. Cl.
CPC ..................................... *H01L 28/86* (2013.01)
USPC .......................... 361/305; 361/303; 361/306.1

(58) Field of Classification Search
USPC ...................................... 361/303, 305, 306.1
See application file for complete search history.

(56) References Cited

U.S. PATENT DOCUMENTS

| | | | |
|---|---|---|---|
| 1,899,176 A | 2/1933 | Bailey | |
| 3,593,319 A | 7/1971 | Barber | |
| 4,156,249 A | 5/1979 | Koo | |
| 4,249,196 A | 2/1981 | Durney et al. | |
| 4,409,608 A | 10/1983 | Yoder | |
| 4,427,457 A | 1/1984 | Carlson et al. | |
| 4,470,096 A | 9/1984 | Guertin | |
| 4,470,099 A | 9/1984 | Sawairi | |
| 4,571,543 A | 2/1986 | Raymond et al. | |
| 4,639,686 A | 1/1987 | Beckenbach et al. | |
| 4,700,457 A | 10/1987 | Matsukawa | |
| 4,731,696 A | 3/1988 | Himes et al. | |
| 4,827,323 A | 5/1989 | Tigelaar et al. | |
| 4,831,431 A | 5/1989 | Hanlon | |
| 4,878,151 A | 10/1989 | Gallichio | |
| 4,914,546 A | 4/1990 | Alter | |
| 4,937,649 A | 6/1990 | Shiba et al. | |

(Continued)

FOREIGN PATENT DOCUMENTS

| | | |
|---|---|---|
| DE | 25 48 563 A1 | 5/1977 |
| DE | 100 46 910 A1 | 10/2001 |

(Continued)

OTHER PUBLICATIONS

Aparicio, R., et al., Capacity Limits and Matching Properties of Integrated Capacitors, IEEE Journal of Solid-State Circuits, vol. 37, No. 3, Mar. 2002, pp. 384-393.

(Continued)

*Primary Examiner* — David M Sinclair
*Assistant Examiner* — Arun Ramaswamy
(74) *Attorney, Agent, or Firm* — Kin-Wah Tong; Kevin T. Cuenot (57) ABSTRACT

An interdigitated capacitor having digits of varying width is disclosed. One embodiment of a capacitor includes a first plurality of conductive digits and a second plurality of conductive digits positioned in an interlocking manner with the first plurality of conductive digits, such that an interdigitated structure is formed. The first plurality of conductive digits and the second plurality of conductive digits collectively form a set of digits, where the width of a first digit in the set of digits is non-uniform with respect to a second digit in the set of digits.

17 Claims, 6 Drawing Sheets

(56) References Cited

U.S. PATENT DOCUMENTS

| | | |
|---|---|---|
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |
| 5,089,878 A | 2/1992 | Lee |
| 5,117,114 A | 5/1992 | Street et al. |
| 5,119,169 A | 6/1992 | Kozono et al. |
| 5,142,639 A | 8/1992 | Kohyama et al. |
| 5,155,658 A | 10/1992 | Inam et al. |
| 5,166,858 A | 11/1992 | Frake et al. |
| 5,172,299 A | 12/1992 | Yamada et al. |
| 5,177,410 A | 1/1993 | Hashiguchi et al. |
| 5,189,594 A | 2/1993 | Hoshiba |
| 5,208,725 A | 5/1993 | Akcasu |
| 5,275,974 A | 1/1994 | Ellul et al. |
| 5,583,359 A | 12/1996 | Ng et al. |
| 5,712,813 A | 1/1998 | Zhang |
| 5,868,388 A | 2/1999 | Wood et al. |
| 5,939,766 A | 8/1999 | Stolmeijer et al. |
| 6,037,621 A | 3/2000 | Wilson |
| 6,064,108 A | 5/2000 | Martinez |
| 6,066,537 A | 5/2000 | Poh |
| 6,297,524 B1 | 10/2001 | Vathulya et al. |
| 6,303,456 B1 | 10/2001 | Pricer et al. |
| 6,303,457 B1 | 10/2001 | Christensen et al. |
| 6,383,858 B1 | 5/2002 | Gupta et al. |
| 6,385,033 B1 | 5/2002 | Javanifard et al. |
| 6,410,954 B1 | 6/2002 | Sowlati et al. |
| 6,417,556 B1 | 7/2002 | Long et al. |
| 6,542,351 B1 | 4/2003 | Kwang |
| 6,570,210 B1 | 5/2003 | Sowlati et al. |
| 6,597,562 B1 | 7/2003 | Hu et al. |
| 6,625,006 B1 | 9/2003 | Aram et al. |
| 6,653,681 B2 | 11/2003 | Appel |
| 6,661,079 B1 | 12/2003 | Bikulcius |
| 6,690,570 B2 | 2/2004 | Hajimiri et al. |
| 6,737,698 B1 | 5/2004 | Paul et al. |
| 6,747,307 B1 | 6/2004 | Vathulya et al. |
| 6,765,778 B1 | 7/2004 | Du et al. |
| 6,819,542 B2 | 11/2004 | Tsai et al. |
| 6,822,312 B2 | 11/2004 | Sowlati et al. |
| 6,880,134 B2 | 4/2005 | Drennan |
| 6,882,015 B2 | 4/2005 | Bernstein et al. |
| 6,897,505 B2 | 5/2005 | Aton |
| 6,903,918 B1 | 6/2005 | Brennan |
| 6,927,125 B2 | 8/2005 | Jones et al. |
| 6,933,551 B1 | 8/2005 | Stribley et al. |
| 6,933,869 B1 | 8/2005 | Starr et al. |
| 6,949,781 B2 | 9/2005 | Chang et al. |
| 6,963,122 B1 | 11/2005 | Soenen et al. |
| 6,972,463 B2 | 12/2005 | Cheng |
| 6,974,744 B1 | 12/2005 | Aram et al. |
| 7,009,832 B1 | 3/2006 | Chen et al. |
| 7,013,436 B1 | 3/2006 | Morton et al. |
| 7,027,287 B2 | 4/2006 | Georgakos |
| 7,038,296 B2 | 5/2006 | Laws |
| 7,050,290 B2 | 5/2006 | Tang et al. |
| 7,116,544 B1 | 10/2006 | Sutardja |
| 7,154,734 B2 | 12/2006 | Schultz et al. |
| 7,161,228 B1 | 1/2007 | Pettit |
| 7,170,178 B2 | 1/2007 | Bely et al. |
| 7,193,263 B2 | 3/2007 | Barth |
| 7,195,971 B2 | 3/2007 | Bernstein et al. |
| 7,202,548 B2 | 4/2007 | Lee |
| 7,205,854 B2 | 4/2007 | Liu |
| 7,259,945 B2 | 8/2007 | Cleveland |
| 7,259,956 B2 | 8/2007 | Fong et al. |
| 7,271,465 B2 | 9/2007 | Jessie et al. |
| 7,274,085 B1 | 9/2007 | Hsu et al. |
| 7,298,001 B1 | 11/2007 | Liu |
| 7,348,624 B2 | 3/2008 | Sakaguchi et al. |
| 7,394,274 B2 | 7/2008 | Muniandy et al. |
| 7,485,914 B2 | 2/2009 | Huang et al. |
| 7,564,264 B1 | 7/2009 | Morrison et al. |
| 7,663,233 B2 | 2/2010 | Lim |
| 7,768,054 B2 | 8/2010 | Benetik |
| 7,944,732 B2 | 5/2011 | de Jong et al. |
| 7,956,438 B2 | 6/2011 | Quinn |
| 7,994,609 B2 | 8/2011 | Quinn |
| 7,994,610 B1 | 8/2011 | Quinn |
| 8,207,592 B2 | 6/2012 | Quinn |
| 8,362,589 B2 | 1/2013 | Quinn |
| 2003/0132475 A1* | 7/2003 | Kanamori ................ 257/306 |
| 2003/0183884 A1* | 10/2003 | Miyazawa ................ 257/401 |
| 2005/0077581 A1 | 4/2005 | Chang et al. |
| 2005/0135042 A1 | 6/2005 | Chiu-Kit Fong et al. |
| 2005/0161725 A1 | 7/2005 | Da Dalt |
| 2006/0203424 A1 | 9/2006 | Chen et al. |
| 2007/0096720 A1 | 5/2007 | Clements et al. |
| 2007/0181973 A1 | 8/2007 | Hung et al. |
| 2007/0190760 A1 | 8/2007 | Coolbaugh et al. |
| 2007/0278551 A1 | 12/2007 | Anthony |
| 2007/0296013 A1 | 12/2007 | Chang et al. |
| 2008/0239619 A1* | 10/2008 | Okamoto et al. ............ 361/303 |
| 2009/0057826 A1 | 3/2009 | Kim et al. |
| 2010/0125989 A1* | 5/2010 | Huang et al. ................ 29/25.42 |
| 2010/0127348 A1 | 5/2010 | Quinn |
| 2010/0127349 A1 | 5/2010 | Quinn |
| 2012/0229203 A1 | 9/2012 | Sadoughi et al. |

FOREIGN PATENT DOCUMENTS

| | | |
|---|---|---|
| DE | 10145 462 A1 | 4/2003 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 01298322 A * | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| JP | 09199973 A * | 7/1997 |
| JP | 11274887 A * | 10/1999 |
| JP | 2001267503 A * | 9/2001 |
| WO | WO 03/090280 | 10/2003 |

OTHER PUBLICATIONS

Amintoosi et al., "Using pattern matching for tiling and packing problems" European Journal of Operational Research, Amsterdam, NL, vol. 83, No. 3, Jul. 10, 2007, pp. 950-960.

Aparicio and Hajimiri, "Capacity Limits and Matching Properties of Integrated Capacitors", IEEE J. Solid-State circuits, vol. 37, No. 3, pp. 384-93, Mar. 2002.

Chan et al., "Analysis of MMIC Structures Using an Efficient Iterative Approach", IEEE Transactions on Microwave Theory and Techniques, vol. 36, No. 1, Jan. 1988, pp. 96-105.

Fukuda, H. et al., "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

Rajagopalan et al., "Optimization of Metal-Metal Comb-Capacitors for RF Applications", Wireless Design & Development, Mar. 4, 2001, pp. 1-4.

(56) References Cited

OTHER PUBLICATIONS

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Samavati, H. et al., "Fractal Capacitor", IEEE Journal of Solid-State Circuit, vol. 33, No. 12 pp., 2035-2041, Dec. 1998.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

Bersuker, G. et al., Mechanism of Electron Trapping and Characteristics of Traps in $HfO_2$ Gate Stacks, IEEE Transactions on Device and Materials Reliability, vol. 7, No. 1, Mar. 2007, pp. 138-145.

Keane, J. et al., "An On-Chip NBTI Sensor for Measuring pMOS Threshold Voltage Degradation", IEEE Transactions on Very Large Scale Integration (VLSI) Systems, 1-10.

\* cited by examiner

INTERDIGITATED CAPACITOR HAVING DIGITS OF VARYING WIDTH

FIELD OF THE DISCLOSURE

This disclosure relates generally to integrated circuits and relates more particularly to interdigitated capacitors for use in integrated circuit technology.

BACKGROUND

Passive electronic components such as capacitors are often used in integrated circuit (IC) applications. One particular type of capacitor is an interdigitated capacitor. A conventional interdigitated capacitor comprises a plurality of interdigitated layers, where each pair of interdigitated layers is separated by an oxide layer (or oxide region). Each interdigitated layer comprises two bars (or interconnects) which are positioned substantially parallel to each other. Extending from each of the bars is a plurality of "digits" (i.e., long conductors). The digits are spaced along the bars such that the digits collectively form an interlocked or interdigitated structure.

Conventional interdigitated capacitors suffer from some drawbacks. For instance, the longer the length of the digits, the more current loss the digits tend to incur. As such, the length of the digits is typically selected to minimize such losses. For instance, multiple interdigitated layers having digits of shorter length typically span the area of the capacitor. Although this effectively minimizes losses, the capacitance density of the capacitor is lowered as a result. In turn, each of the interdigitated layers will require two electrodes in order to provide the necessary capacitance density. These electrodes are located outside of the interdigitated structure and consume space in the areas of the bars and oxide layer. Thus, capacitor area is not utilized in a manner that maximizes performance.

SUMMARY

An interdigitated capacitor having digits of varying width is disclosed. One embodiment of a capacitor includes a first plurality of conductive digits and a second plurality of conductive digits positioned in an interlocking manner with the first plurality of conductive digits, such that an interdigitated structure is formed. The first plurality of conductive digits and the second plurality of conductive digits collectively form a set of digits, where the width of a first digit in the set of digits is non-uniform with respect to a second digit in the set of digits.

In various embodiments of the capacitor, a first subset of the set of digits that is positioned closest to the ends of the interdigitated structure has widths that are wider than a second subset of the set of digits that is positioned closest to the center of the interdigitated structure. A first subset of the set of digits that is positioned closest to the ends of the interdigitated structure has widths that are three to five times wider than a second subset of the set of digits that is positioned closest to the center of the interdigitated structure. A first defined number of a subset of the set of digits that is positioned closest to the ends of the interdigitated structure has a first width, and a remainder of the digits in the set of digits has a second width that is narrower than the first width.

The width of each digit in the set of digits gradually tapers from a widest width at digits positioned at ends of the interdigitated structure to a narrowest width at a digit positioned at a center of the interdigitated structure. The relative widths of the digits in the set of digits are determined in accordance with a magnetic H field distribution of the interdigitated structure. The width of a particular one of the set of digits is proportional to the amount of current carried by the particular one of the set of digits. The gaps between the digits in the set of digits are substantially uniform in size. The first plurality of conductive digits and the second plurality of conductive digits are formed from at least one of: copper, doped polysilicon, aluminum, or titanium nitride. The first plurality of conductive digits is formed from a first material, and the second plurality of conductive digits is formed from a second material that is different from the first material. The capacitor further includes at least one bar having a feeding point that is coupled to the interdigitated structure; and a first subset of the set of digits that is positioned closest to the feeding point has widths that are wider than a remainder of the set of digits.

According to another embodiment, a method for forming a capacitor is provided. The method includes: forming a first plurality of conductive digits and forming a second plurality of conductive digits positioned in an interlocking manner with the first plurality of conductive digits, such that an interdigitated structure is formed. The first plurality of conductive digits and the second plurality of conductive digits collectively form a set of digits, where the width of a first digit in the set of digits is non-uniform with respect to a second digit in the set of digits.

In various embodiments of the method, a first subset of the set of digits that is positioned closest to the ends of the interdigitated structure has widths that are wider than a second subset of the set of digits that is positioned closest to the center of the interdigitated structure. A first subset of the set of digits that is positioned closest to the ends of the interdigitated structure has widths that are three to five times wider than a second subset of the set of digits that is positioned closest to the center of the interdigitated structure. A first defined number of a subset of the set of digits that is positioned closest to the ends of the interdigitated structure has a first width, and a remainder of the digits in the set of digits has a second width that is narrower than the first width.

The width of the digits in the set of digits gradually tapers from a widest width at the ends of the interdigitated structure to a narrowest width at the center of the interdigitated structure. The relative widths of the digits in the set of digits are determined in accordance with a magnetic H field distribution of the interdigitated structure, and the width of a particular one of the set of digits is proportional to the amount of current carried by the particular one of the set of digits. At least one bar having a feeding point is coupled to the interdigitated structure, and a first subset of the set of digits that is positioned closest to the feeding point has widths that are wider than a remainder of the set of digits.

According to another embodiment, a capacitor includes a single interdigitated layer, wherein the single interdigitated layer comprises a first plurality of conductive digits and a second plurality of conductive digits positioned in an interlocking manner. The first plurality of conductive digits and the second plurality of conductive digits are positioned such that an interdigitated structure is formed.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

DETAILED DESCRIPTION OF THE DRAWINGS

An interdigitated capacitor having digits of varying width is disclosed. As discussed above, an interdigitated capacitor is a particular type of capacitor that produces capacitor-like, high-pass characteristics using long conductors or "digits." One embodiment of an interdigitated capacitor includes a plurality of digits, where those digits located closer to the ends of the interdigitated structure are wider than those digits located closer to the center of the interdigitated structure. In a further embodiment, the width of the digits gradually tapers from a widest point at the ends of the interdigitated structure to a narrowest point at the center of the interdigitated structure. As discussed in greater detail below, this arrangement allows the digits to be lengthened so that the interdigitated capacitor structure can be applied to the bar and oxide layers, while increasing the capacitance density of the interdigitated capacitor.

Figure 1:
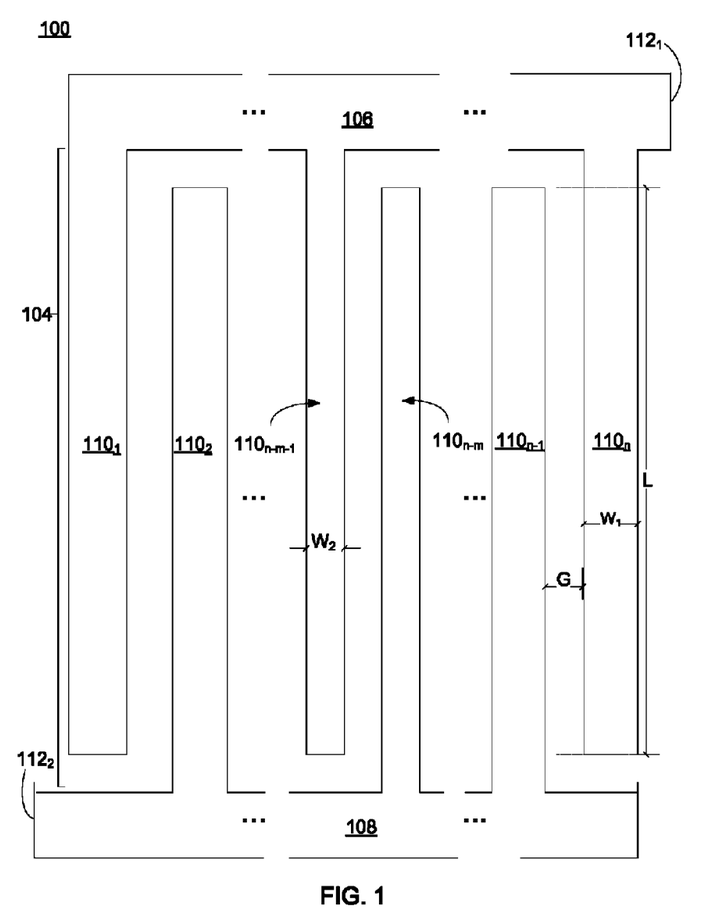
FIG. 1 is a plan view illustrating a first embodiment of an interdigitated capacitor.

FIG. 1 is a plan view illustrating a first embodiment of an interdigitated capacitor 100. Specifically, FIG. 1 illustrates the interdigitated capacitor 100 in the x and z dimensions. It is noted that FIG. 1 is not necessarily drawn to scale, and that the interdigitated capacitor 100 is not necessarily limited by the dimensions or quantities illustrated (which are meant primarily to facilitate the understanding of the reader).

As illustrated, the capacitor 100 comprises a first bar 106 and a second bar 108, which are positioned substantially parallel to each other. Extending from each of the first bar 106 and the second bar 108 are a plurality of digits $110_1$-$110_n$ (hereinafter collectively referred to as "digits 110"). Collectively, the digits 110 form an interlocked or interdigitated structure 104. Current is provided to the interdigitated structure via at least one "feeding point" or electrode $112_1$-$112_2$ (hereinafter collectively referred to as "electrodes 112") located on the first bar 106 and the second bar 108. In one embodiment, each of the first bar 106 and the second bar 108 includes an electrode (broadly a feeding point) 112 for providing current. It should be noted that the feeding point located on the bars 106 and 108 can be deployed at any positions on the bars, e.g., at the extreme ends of the bars, at the center of the bars, and any other locations between the extreme ends and the center of the bars.

In one embodiment, the digits 110 are formed of a conductive material such as copper, doped polysilicon, aluminum, or titanium nitride, among other potential materials. The composition of the digits 110 extending from the first bar 106 may differ from the composition of the digits extending from the second bar 108. The gaps between the digits 110 and the bars 106, 108 generally comprise a dielectric material such as silicon dioxide.

As illustrated, the width of the digits 110 is non-uniform from digit to digit (e.g., at least two or more digits have different widths). For example, in one embodiment, the digits 110 that are located closer to the ends of the interdigitated structure 104 (e.g., digits $110_1$, $110_2$, $110_{n-1}$, and $110_n$) are wider than the digits that are located closer to the center of the interdigitated structure 104 (e.g., digits $110_{n-m-1}$ and $110_{n-m}$).

In one embodiment in particular, the digits 110 that are located closer to the ends of the interdigitated structure 104 are three to five times wider than the digits that are located closer to the center of the interdigitated structure 104.

In another embodiment, a specified number of digits 110 located closer to the ends of the interdigitated structure 104 are wider than a remainder of the digits 110 in the interdigitated structure. For example, moving from the ends of the interdigitated structure 104 to the center of the interdigitated structure 104, the first x digits 110 have a first width, while the remaining digits 110 have a second width that is narrower than the first width.

In yet another embodiment, the widths of the digits 110 gradually taper from a widest width $W_1$ at the ends of the interdigitated structure 104 to a narrowest width $W_2$ at the center of the interdigitated structure 104, such that the widths of the digits 110 residing at the intermediate points of the interdigitated structure 104 (i.e., between the ends and the center) have widths somewhere between $W_1$ and $W_2$.

Figure 2:
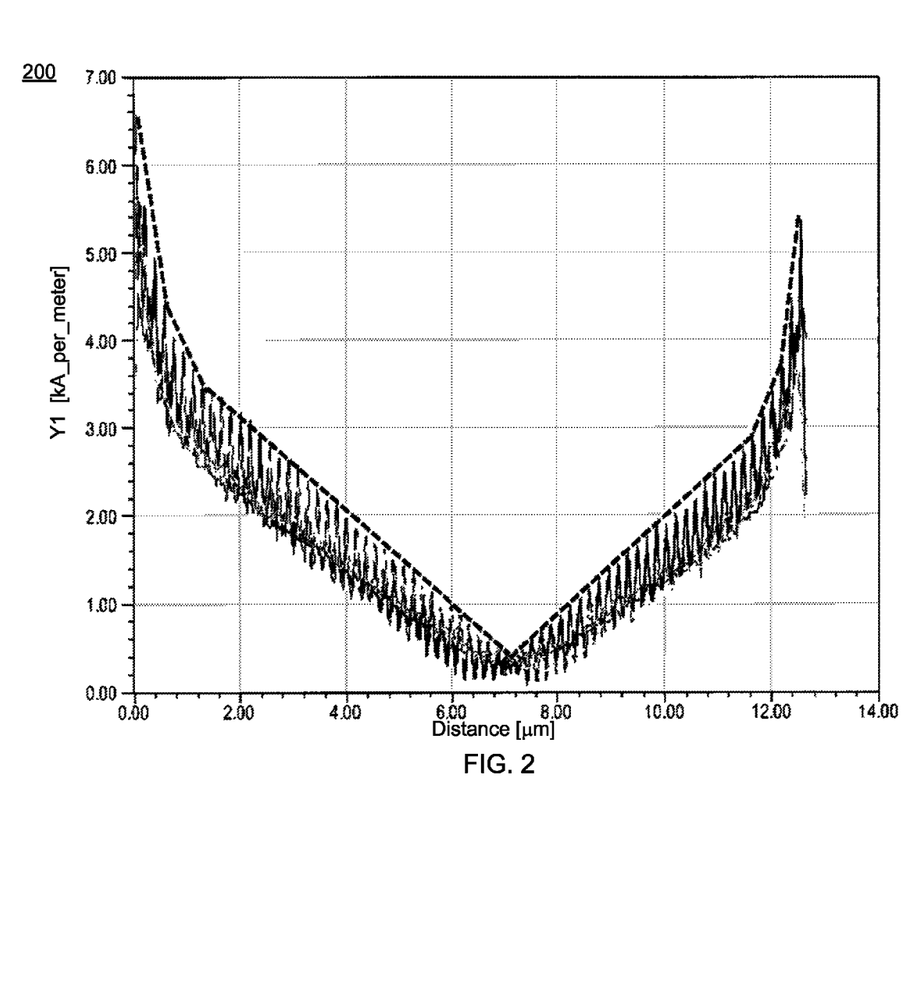
FIG. 2 is a graph illustrating the magnetic H field distribution for a conventional interdigitated capacitor.

In another embodiment still, the relative widths of the digits 110 are determined in accordance with the magnetic H field distribution of the interdigitated structure 104. FIG. 2, for example, is a graph illustrating the magnetic H field distribution for a conventional interdigitated capacitor. Specifically, FIG. 2 maps the magnitude of the current density (in kilo Amps per meter) to the distance (in micrometers) from the feeding location of the interdigitated structure (i.e., the point at which current is injected). As illustrated, the current density decreases as one moves from the ends of the interdigitated structure to the center of the interdigitated structure. By contrast, the distribution of the electrical field across the interdigitated structure is relatively uniform.

Thus, in one embodiment, the digits 110 closer to the center of the interdigitated structure 104 (i.e., the digits 110 that carry the least current) are made the narrowest (e.g., as narrow as the mechanical tolerances of the interdigitated capacitor 100 will allow). As one moves outward from the center of the interdigitated structure 104, the digits 110 are made proportionally wider as they carry more current, with the widest digits 110 being the digits 110 located closest to the ends of the interdigitated structure 104. This arrangement will increase the capacitance density of the interdigitated capacitor 100.

In another embodiment, the widest digits 110 are located closest to the electrodes 112. For example, in the exemplary embodiment illustrated in FIG. 1, the widest digits $110_1$ and $110_n$ are also the closest digits to the electrodes 112, which are positioned at opposite ends of the first bar 106 and the second bar 108, respectively; the narrowest digits are the digits furthest from the electrodes 112 (e.g., digits $110_{n-m-1}$ and $110_{n-m}$). Thus, the widest digits $110_1$ and $110_n$ are also positioned at opposite ends of the first bar 106 and the second bar 108, respectively.

Figure 5:
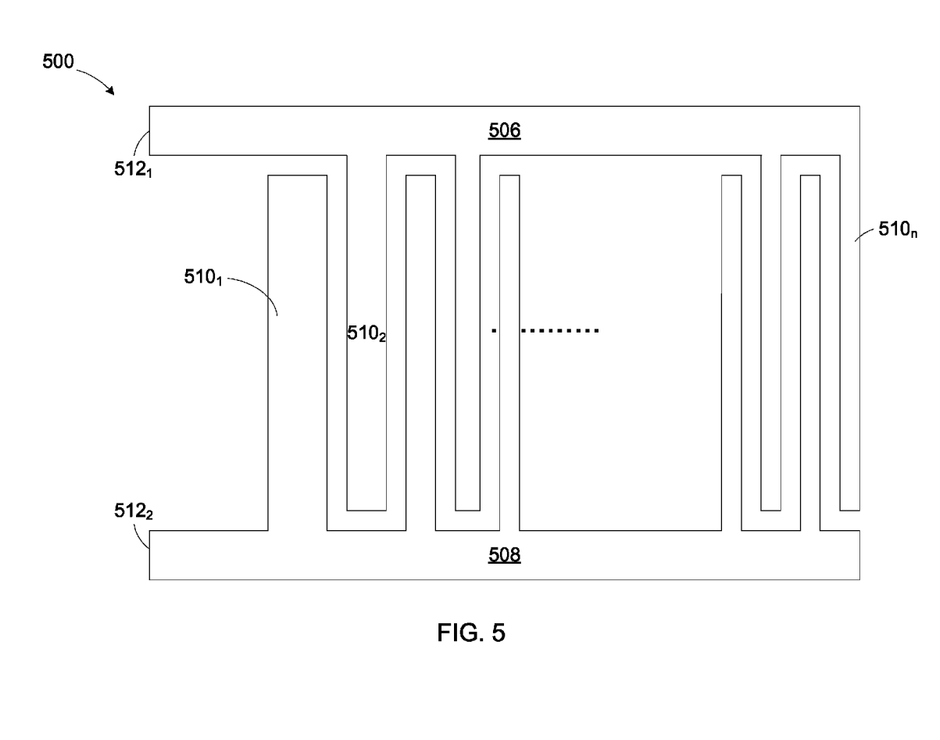
FIG. 5 is a plan view illustrating a second embodiment of an interdigitated capacitor.
Figure 6:
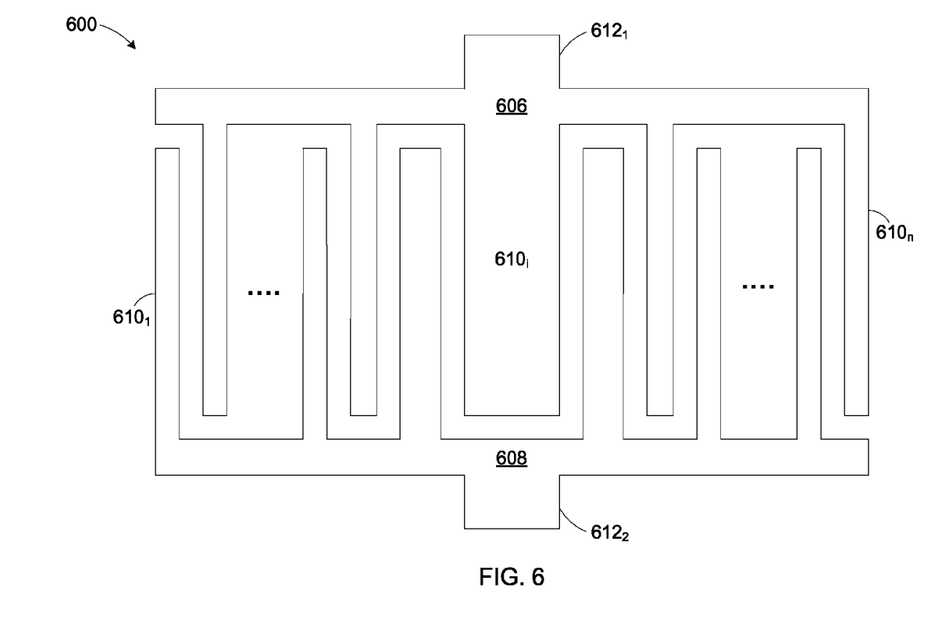
FIG. 6 is a plan view illustrating a third embodiment of an interdigitated capacitor.

By way of further example, FIG. 5 is a plan view illustrating a second embodiment of an interdigitated capacitor 500; FIG. 6 is a plan view illustrating a third embodiment of an interdigitated capacitor 600. In FIG. 5, the electrodes $512_1$-$512_2$ (hereinafter collectively referred to as "electrodes 512") are located on the same ends of the first bar 506 and the second bar 508, respectively (i.e., on the left-hand side of the illustration). Again, the widest digits $510_1$ and $510_2$ are also the closest digits to the electrodes 512; the narrowest digits are the digits furthest from the electrodes 512 (e.g., digit $510_n$).

Thus, the widest digits $510_1$ and $510_2$ are also positioned on the same ends of the first bar 506 and the second bar 508, respectively (i.e., such that the digits $510_1$ and $510_2$ are next to each other).

In FIG. 6, the electrodes $612_1$-$612_2$ (hereinafter collectively referred to as "electrodes 612") are located at approximately the centers of the first bar 606 and the second bar 608, respectively. Again, the widest digit $610_x$ is also the closest digit to the electrodes 612 (in this case, a single digit 610, that extends between the electrodes 612); the narrowest digits are the digits furthest from the electrodes 612 (e.g., digits $610_1$ and $610_n$).

In any of the above cases, the gaps G between the digits 110 remain substantially uniform. That is, although the widths of the digits 110 will vary, the size of the gaps G between the digits will not vary substantially.

As illustrated in FIG. 1, the interdigitated capacitor 100 can be formed with multiple layers. The configuration of the interdigitated capacitor 100, including the digits 110 of varying widths, allows the digits 110 to be lengthened to minimizes the space consumed by electrodes in the capacitor 100 (e.g., in the areas of the first bar 106 and second bar 108), while increasing the capacitance density of the interdigitated capacitor. Since the widths of the digits 110 carrying the most current (i.e., the digits closer to the ends of the interdigitated structure 104) are increased, these wider digits 110 will not see an increase in losses. Moreover, since the digits 110 closer to the center of the interdigitated structure 104 carry little to no current, the increase in the lengths of the digits 110 will not produce a significant increase in losses. Thus, the quality factor (or "Q factor") of the capacitor 100 (i.e., the capacitor's capacitive reactance divided by the capacitor's equivalent series resistance) can be maintained.

Figure 3:
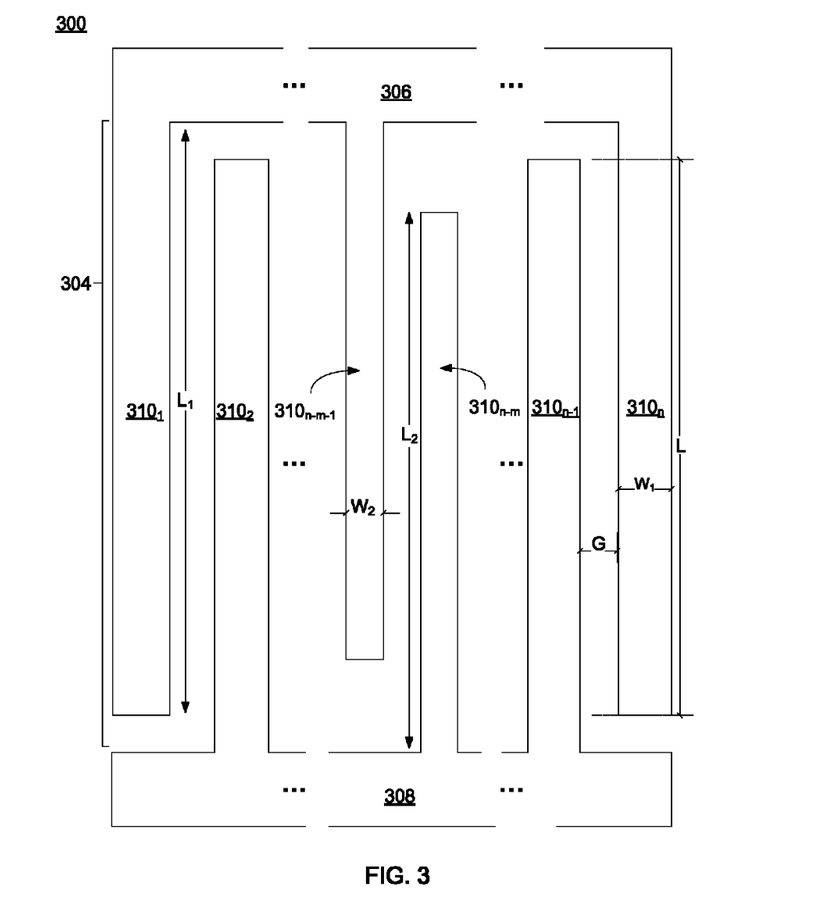
FIG. 3 is a plan view illustrating a fourth embodiment of an interdigitated capacitor.

FIG. 3 is a plan view illustrating a second embodiment of an interdigitated capacitor 300. Specifically, FIG. 1 illustrates the interdigitated capacitor 100 in the x and z dimensions. It is noted that FIG. 1 is not necessarily drawn to scale, and that the interdigitated capacitor 100 is not necessarily limited by the dimensions or quantities illustrated (which are meant primarily to facilitate the understanding of the reader).

As illustrated, the capacitor 300 comprises a first bar 306 and a second bar 308, which are positioned substantially parallel to each other. Extending from each of the first bar 306 and the second bar 308 are a plurality of digits $310_1$-$310_n$ (hereinafter collectively referred to as "digits 310"). Collectively, the digits 310 form an interlocked or interdigitated structure 304.

In one embodiment, the digits 310 are formed of a conductive material such as copper, doped polysilicon, aluminum, or titanium nitride, among other potential materials. The composition of the digits 310 extending from the first bar 306 may differ from the composition of the digits extending from the second bar 308. The gaps between the digits 310 and the bars 306, 308 generally comprise a dielectric material such as silicon dioxide.

As illustrated, the width of the digits 310 is non-uniform from digit to digit (e.g., at least two or more digits have different widths). In one embodiment, the widths of the digits 310 may be varied in any of the manners discussed above. Additionally, the length of the digits 310 is also non-uniform from digit to digit (e.g., at least two or more digits have different lengths). For instance, the lengths of the digits 310 may vary from a longest length of $L_1$ to a shortest length of $L_2$. In one embodiment, the lengths of the digits 310 are varied based on any of the criteria discussed above for varying the widths of the digits 310.

Figure 4:
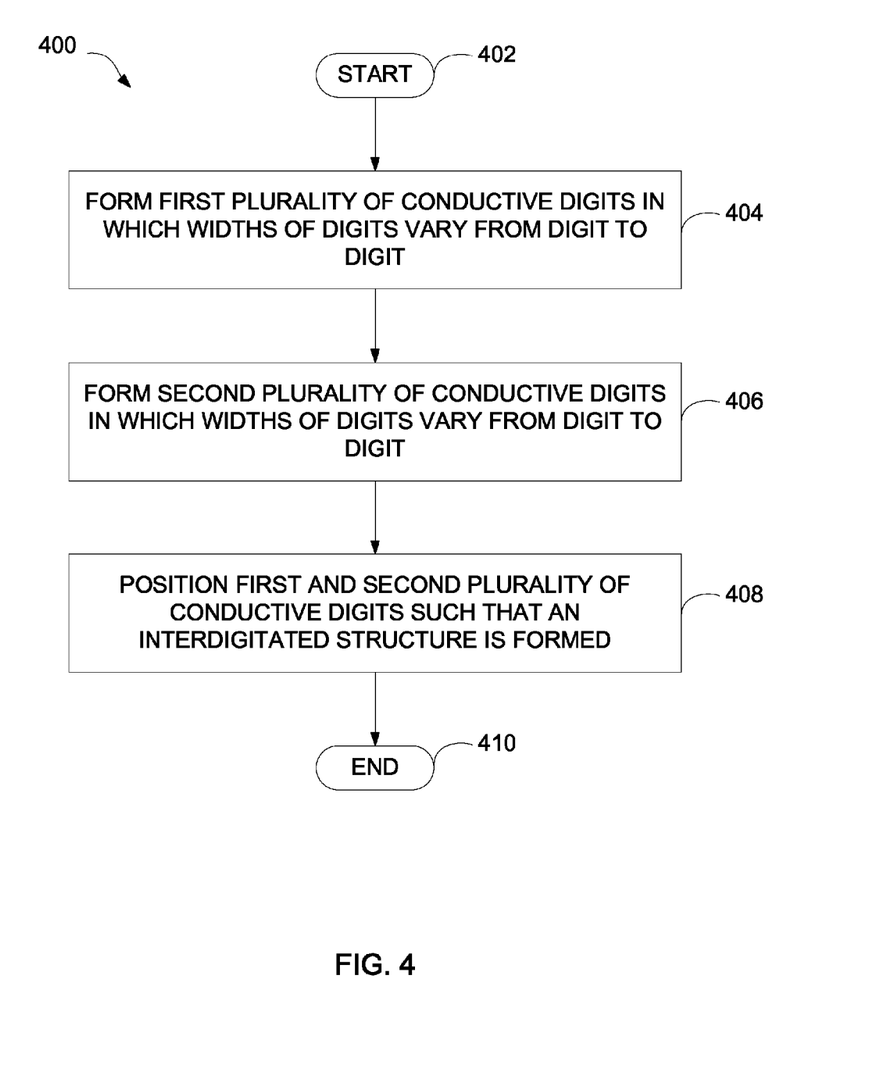
FIG. 4 is a flow diagram illustrating one embodiment of a method for forming a capacitor.

FIG. 4 is a flow diagram illustrating one embodiment of a method 400 for forming a capacitor. The method 400 may be implemented, for example, in order to form a capacitor such as the capacitors illustrated in FIGS. 1 and 3.

The method 400 is started in step 402. In step 404, a first plurality of conductive digits is formed, in which the widths of the digits vary from digit to digit. Optionally, the lengths of the digits may also vary from digit to digit. In one embodiment, the widths (and optionally lengths) of the digits are varied according to any of the criteria discussed above. The first plurality of conductive digits is connected by a first bar from which the digits extend in a spaced-apart manner. In one embodiment, the first plurality of conductive digits is formed of a conductive material such as copper, doped polysilicon, aluminum, or titanium nitride, among other potential materials. Gaps between the digits in the first plurality of conductive digits generally comprise a dielectric material such as silicon dioxide.

In step 406, a second plurality of conductive digits is formed, in which the widths of the digits vary from digit to digit. Optionally, the lengths of the digits may also vary from digit to digit. In one embodiment, the widths (and optionally lengths) of the digits are varied according to any of the criteria discussed above. The second plurality of conductive digits is connected by a second bar from which the digits extend in a spaced-apart manner. In one embodiment, the second plurality of conductive digits is formed of a conductive material such as copper, doped polysilicon, aluminum, or titanium nitride, among other potential materials. The second plurality of conductive digits need not necessarily be formed from the same conductive material as the first plurality of conductive digits. Gaps between the digits in the second plurality of conductive digits generally comprise a dielectric material such as silicon dioxide.

In step 408, the first plurality of conductive digits and the second plurality of conductive digits are positioned to form an interdigitated structure. This interdigitated structure forms the main structure of an interdigitated capacitor, as discussed above. Those skilled in the art will appreciate that the final interdigitated capacitor may comprise additional components such as electrodes.

The method 400 then ends in step 410.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:
1. A capacitor comprising:
a first plurality of conductive digits;
a second plurality of conductive digits positioned in an interlocking manner with the first plurality of conductive digits such that an interdigitated structure is formed;
wherein the first plurality of conductive digits and the second plurality of conductive digits collectively form a set of digits, and wherein a width of a first digit in the set of digits is non-uniform with respect to a second digit in the set of digits; and
a first bar and a second bar coupled to the interdigitated structure wherein each of the first bar and the second bar has a feeding point at which current is injected;
wherein each digit of the first plurality of conductive digits is coupled to the first bar at a single end;

wherein each digit of the second plurality of conductive digits is coupled to the second bar at a single end;

wherein digits coupled to the first bar and positioned closest to the feeding point of the first bar have widths that are wider than a remainder of the digits coupled to the first bar;

wherein digits coupled to the second bar and positioned closest to the feeding point of the second bar have widths that are wider than a remainder of the digits coupled to the second bar; and wherein gaps between the digits in the set of digits are substantially uniform in size.

2. The capacitor of claim 1, wherein:

the digits coupled to the first bar and positioned closest to the feeding point of the first bar have widths that are wider than digits coupled to the first bar and positioned farthest from the feeding point of the first bar; and the digits coupled to the second bar and positioned closest to the feeding point of the second bar have widths that are wider than digits coupled to the second bar and positioned farthest from the feeding point of the second bar.

3. The capacitor of claim 1, wherein digits positioned closest to each feeding point have widths that are three to five times wider than digits positioned farthest from each feeding point of the same bar.

4. The capacitor of claim 1, wherein:

the feeding point of the first bar is located at an end of the first bar that is perpendicular to an end coupled to the first plurality of digits; and the feeding point of the second bar is located at an end of the first bar that is perpendicular to an end coupled to the second plurality of digits.

5. The capacitor of claim 1, wherein:

for digits coupled to the first bar, the width of each digit gradually tapers from a widest width for the digit positioned closest to the feeding point of the first bar to a narrowest width for the digit positioned farthest away from the feeding point of the first bar; and for digits coupled to the second bar, the width of each digit gradually tapers from a widest width for the digit positioned closest to the feeding point of the second bar to a narrowest width for the digit positioned farthest away from the feeding point of the second bar.

6. The capacitor of claim 1, wherein the feeding point of the first bar is located at a center of the first bar and the feeding point of the second bar is located at a center of the second.

7. The capacitor of claim 1, wherein the first plurality of conductive digits and the second plurality of conductive digits are formed from at least one of:

copper, doped polysilicon, aluminum, or titanium nitride.

8. The capacitor of claim 1, wherein the first plurality of conductive digits is formed from a first material, and the second plurality of conductive digits is formed from a second material that is different from the first material.

9. A method for forming a capacitor, the method comprising:

forming a first plurality of conductive digits;

forming a second plurality of conductive digits positioned in an interlocking manner with the first plurality of conductive digits such that an interdigitated structure is formed;

wherein the first plurality of conductive digits and the second plurality of conductive digits collectively form a set of digits, and wherein a width of a first digit in the set of digits is non-uniform with respect to a second digit in the set of digits; and forming a first bar and a second bar coupled to the interdigitated structure wherein each of the first bar and the second bar has a feeding point at which current is infected;

wherein each digit of the first plurality of conductive digits is coupled to the first bar at a single end;

wherein each digit of the second plurality of conductive digits is coupled to the second bar at a single end;

wherein digits coupled to the first bar and positioned closest to the feeding point of the first bar have widths that are wider than a remainder of the digits coupled to the first bar;

wherein digits coupled to the second bar and positioned closest to the feeding point of the second bar have widths that are wider than a remainder of the digits coupled to the second bar; and wherein gaps between the digits in the set of digits are substantially uniform in size.

10. The method of claim 9, wherein:

the digits coupled to the first bar and positioned closest to the feeding point of the first bar have widths that are wider than digits coupled to the first bar and positioned farthest from the feeding point of the first bar; and the digits coupled to the second bar and positioned closest to the feeding point of the second bar have widths that are wider than digits coupled to the second bar and positioned farthest from the feeding point of the second bar.

11. The method of claim 9, wherein digits positioned closest to each feeding point have widths that are three to five times wider than digits positioned farthest away from each feeding point of the same bar.

12. The method of claim 9, wherein:

the feeding point of the first bar is located at an end of the first bar that is perpendicular to an end coupled to the first plurality of digits; and the feeding point of the second bar is located at an end of the first bar that is perpendicular to an end coupled to the second plurality of digits.

13. The method of claim 9, wherein:

for digits coupled to the first bar, the width of each digit gradually tapers from a widest width for the digit positioned closest to the feeding point of the first bar to a narrowest width for the digit positioned farthest away from the feeding point of the first bar; and for digits coupled to the second bar, the width of each digit gradually tapers from a widest width for the digit positioned closest to the feeding point of the second bar to a narrowest width for the digit positioned farthest away from the feeding point of the second bar.

14. The method of claim 9, wherein the feeding point of the first bar is located at a center of the first bar and the feeding point of the second bar is located at a center of the second bar.

15. A capacitor comprising:

a single interdigitated layer, wherein the single interdigitated layer comprises:

a first plurality of conductive digits; and a second plurality of conductive digits positioned in an interlocking manner with the first plurality of conductive digits such that an interdigitated structure is formed;

wherein the first plurality of conductive digits are coupled to a first bar comprising a first electrode;

wherein the second plurality of conductive digits are coupled to a second bar comprising a second electrode;

wherein a subset of the first plurality of digits coupled to the first bar and positioned closest to the first electrode has widths that are wider than a remainder of the first plurality of digits;

wherein a subset of the second plurality of digits coupled to the second bar and positioned closest to the second electrode has widths that are wider than a remainder of the second plurality of digits; and wherein gaps between the digits in a set of digits formed of the first plurality of conductive digits and the second plurality of conductive digits collectively are substantially uniform in size.

16. The capacitor of claim 15, wherein:

the first electrode is located at a center of the first bar; and
the second electrode is located at a center of the second bar.

17. The capacitor of claim 15, wherein:

the first electrode is located at an end of the first bar that is perpendicular to an end coupled to the first plurality of digits; and the second electrode is located at an end of the second bar that is perpendicular to an end coupled to the second plurality of digits.

* * * * *